United States Patent [19]
Langford et al.

[11] Patent Number: 5,140,202
[45] Date of Patent: Aug. 18, 1992

[54] DELAY CIRCUIT WHICH MAINTAINS ITS DELAY IN A GIVEN RELATIONSHIP TO A REFERENCE TIME INTERVAL

[75] Inventors: Stephen P. Langford, Clifton, England; Kenneth D. Gennetten, Fort Collins, Colo.

[73] Assignee: Hewlett-Packard Company, Palo Alto, Calif.

[21] Appl. No.: 362,114

[22] Filed: Jun. 5, 1989

[51] Int. Cl.$^5$ ............................................ H03K 5/13
[52] U.S. Cl. ................................. 307/603; 307/265; 307/266; 307/271; 307/234; 328/127
[58] Field of Search ............ 307/265, 266, 271, 273, 307/359, 601, 603, 234; 328/127, 128

[56] References Cited

U.S. PATENT DOCUMENTS

| Re. 31,551 | 4/1984 | Biorke | 307/603 |
|---|---|---|---|
| 3,024,417 | 3/1962 | Secretan | 328/63 |
| 3,541,352 | 11/1970 | Merril et al. | 328/127 |
| 3,569,842 | 3/1971 | Schroyer | 307/603 |
| 3,648,080 | 3/1972 | Nakaya | 307/265 |
| 3,668,423 | 6/1972 | Couch | 307/265 |
| 3,693,102 | 9/1972 | Harf | 307/265 |
| 3,712,994 | 1/1973 | Graziani | 307/293 |
| 3,820,029 | 6/1974 | McKinley | 307/265 |
| 4,071,781 | 1/1978 | Kayalioglu | 307/265 |
| 4,103,251 | 7/1978 | Glick | 307/445 |
| 4,191,932 | 3/1980 | Nagahama | 307/228 |
| 4,496,861 | 1/1985 | Bazes | 307/605 |
| 4,504,749 | 3/1985 | Yoshida | 307/271 |
| 4,565,976 | 1/1986 | Campbell | 331/25 |
| 4,567,448 | 1/1986 | Ikeda | 331/25 |
| 4,572,966 | 2/1986 | Hepworth | 307/603 |
| 4,588,905 | 5/1986 | Kojima | 307/603 |
| 4,631,600 | 12/1986 | Fukui | 358/320 |
| 4,652,778 | 3/1987 | Hosoya et al. | 307/603 |
| 4,710,653 | 12/1987 | Yee | 307/603 |
| 4,754,163 | 6/1988 | Aue et al. | 307/265 |
| 4,800,341 | 1/1989 | Johnson | 307/529 |
| 4,899,071 | 2/1990 | Morales | 307/605 |

FOREIGN PATENT DOCUMENTS 0267035 5/1988 European Pat. Off. .
0101523 6/1983 Japan .............................. 307/603

OTHER PUBLICATIONS

Hamilton, "Handbook of liner integrated electronics for research"; 1977.
Gorski-Popiel; "Frequent Synthesis Techniques and Applications"; 1975.

Primary Examiner—Stanley D. Miller
Assistant Examiner—Terry D. Cunningham
Attorney, Agent, or Firm—Richard F. Schuette

[57] ABSTRACT

A delay circuit for producing in an electrical circuit a time delay. The circuit includes a pulse generator which produces an edge at a given time interval after an edge is applied to its input. The time interval can be adjusted so that it automatically follows a reference time interval such as a clock period. The circuit has application in the read circuitry of digital tape devices.

7 Claims, 2 Drawing Sheets

DELAY CIRCUIT WHICH MAINTAINS ITS DELAY IN A GIVEN RELATIONSHIP TO A REFERENCE TIME INTERVAL

BACKGROUND OF THE INVENTION

This invention relates to electrical circuits for introducing time delays into an electrical path.

There is often a requirement in electrical or electronic circuits for an electrical signal or signals to be delayed by some specified time interval. A common way in which the time delay can be introduced is by means of an analogue delay line. Such delay lines are physically bulky, which can present problems when used in devices employing printed circuit boards, have relatively poor tolerances typically of the order of 5% and often are only available in certain standard values. Delay lines are usually the only option available when it is required to delay analogue signals. Digital delays can be implemented in one of a number of ways including the following:

1. An analogue delay line of the type just discussed in conjunction with logic buffers.
2. Using monostable devices.
3. Using high frequency clocks and counters.

Monostable devices are commonly employed to provide time delays in digital electronic systems. In such devices the delay provided by the monostable device is determined by a resistor capacitor arrangement which is usually external to the device. The main problem with such devices is the uncertainty in the actual value of the generated delay. The delay is a function of the values of the resistor and capacitor in the RC network, the temperature and supply voltage and variations in device to device parameters. This uncertainty can often be very large and can thus make the devices impractical in applications where delays of moderate accuracy are required. The third technique referred to above relies on the use of a counter and a high frequency clock to provide delays which are a multiple of some basic delay. At the start of the time delay interval the counter is loaded and allowed to count until it reaches some predetermined value at which the delay is deemed to have ended. Arrangements of this type require a moderate amount of hardware for their implementation and a high frequency clock. The technique does however have the advantage that a delay can be readily varied in steps equal to the period of that high frequency clock. The main disadvantage of the system is that the actual value of the delay generated has a quantisation error corresponding to one period of the high frequency clock, i.e. a high frequency clock of 1 Mhz means delays will have one microsecond tolerance.

An example of apparatus in which time delays are required is in the data separator circuit of a digital tape recording device. In such devices there is a phase locked loop which generates a read reference clock from read transitions. The phase controlled loop operates by adjusting a reference clock in dependence on the misalignment between transitions and the edges of clock signals. To facilitate measurement of the misalignment, the phase controlled loop incorporates a delay line which is provided to allow for the fact that transitions can arrive after a reference clock edge has passed. In the ideal situation the delay introduced by the delay line should be equal to half the reference clock period. It is conventional to use a fixed delay which only provides an nominal delay when the apparatus is operating under ideal conditions, namely when the read transitions occur at a predetermined fixed frequency. What the apparatus essentially does is determine the center of a time window in which data can arrive from the tape. If data arrives in that window it is decoded without error, but if it arrives outside the window a decoding error occurs. Such errors are clearly undesirable. A problem associated with tape drives is that small changes in the speed at which the drive runs affect the size of the decoding time window. For example if the drive is running fast then the window shrinks slightly below its nominal value. Thus, if the selected delay has been optimised for a drive running at 120 inches per second it is not the optimised value the same drive running 1% slower., this can lead to errors.

BRIEF SUMMARY OF THE INVENTION

The present invention is concerned with a circuit which can produce a delay which is variable automatically to track changes in parameters such as the speed of a tape drive.

According to the present invention there is provided an electrical circuit for producing in an electrical path a time delay, comprising a pulse generator which is arranged to produce at its output an edge or transition at a given time interval after an edge or transition is applied to an input thereof, the pulse generator having a control input to which a signal can be applied to vary said time interval, means for producing an electrical signal indicative of said time interval, a comparing circuit arranged to receive said signal and a further signal indicative of a reference time interval, said comparing means producing an error signal which is applied to said control input of said pulse generator to maintain the time interval in a given relationship to the said reference time interval.

The pulse generator may be a voltage controlled pulse generator and said error signal may be a voltage signal.

The voltage controlled pulse generator may comprise a monostable having an associated RC network. The reference signal may be derived from a clock signal, the period of which varies in accordance with some external parameter such as the speed of a tape drive.

DETAILED DESCRIPTION OF THE INVENTION

Figure 1:
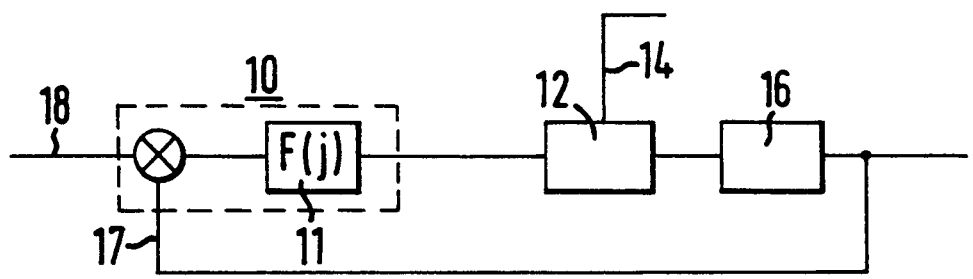
FIG. 1 is a block schematic diagram of a circuit for introducing a delay in accordance with the present invention.

Referring now to FIG. 1, the circuit for introducing a time delay into an electrical path comprises a comparison stage 10 which includes an integrator 11 and which is connected to a voltage controlled pulse generator 12. The voltage controlled generator has an input line 14 along which the signal to be delayed can be fed and an output 15 which is connected to logic circuitry shown at 16. The logic circuitry 16 has an output which is fed back to one input 17 of the comparison stage 10. The comparison stage 10 has a second input 18 on which it receives a signal which is indicative of a time period to which the output of the delay circuit is to be referenced. This signal can, for example, be derived from a clock signal and be indicative of the period of that clock signal. The signal on input 17 which is fed from the logic circuitry 16 is indicative of the time delay generated by the circuit 12.

The comparison stage 10 in effect comprises a differential integrator which receives two pulse inputs on lines 17 and 18, one of which has a width which corresponds to the period of an input clock and the other of which has a width which corresponds to the period of the delay generated by the circuit 12. The integrator integrates both pulses and compares the integral of the pulse on line 18 with the integral of the pulse on line 17. The output of the integrator is thus a function of the difference in pulse widths between two inputs on lines 18 and 17. The output from the differential integrator is a voltage signal which is fed to the voltage controlled pulse generator 12. This can consist of a simple monostable device and the output from the differential integrator controls the time delay introduced into the path of the signal on line 14 in such a way as to reduce the error between the inputs 17 and 18. Increasing the input voltage to this device decreases the delay which it generates and vice versa. Thus the circuit shown in FIG. 1 is in effect a closed loop in which the delay provided by the pulse generator 12 is adjusted automatically to follow any variation in the input clock period as represented by the pulse signal at the input 18. The circuit has applications in devices where there is a need to produce a time delay which is related to some rate which may vary over the course of time so that there is a need to adjust that time delay to follow variations in the rate, or when there is a requirement for a high accuracy fixed delay.

Figure 3:
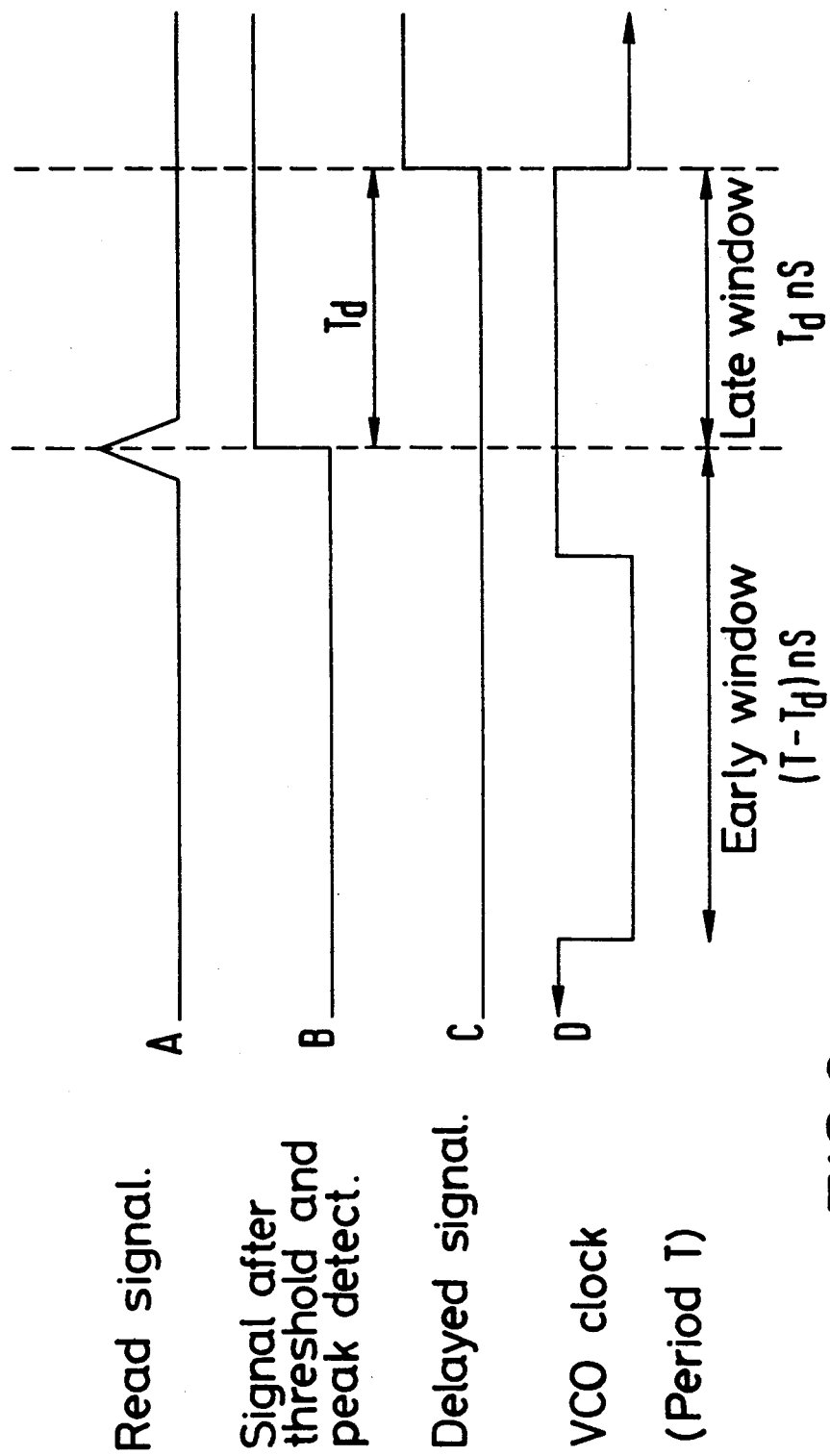
FIG. 3 is a waveform diagram illustrating the operation of a decoder of a digital tape device.

An example of such a requirement is in a digital tape device. In such devices, data is recorded on tape in the modified frequency modulation, MFM format and the read circuitry of such devices employs a phase locked loop to generate a read reference from read transitions. FIG. 3 of the drawings illustrates the read signal in waveform A and this is converted into an edge as illustrated in waveform B. The phase controlled loop operates by adjusting the reference clock in dependence on the mis-alignment between transitions and clock edges. To facilitate measurement of the mis-alignment, the phase controlled loop incorporates a delay line, the purpose of which is to allow for the fact that transitions may arrive after a reference clock edge has passed. The delayed signal is illustrated in waveform C of FIG. 3 and the voltage controlled oscillator clock signal of period T is shown in waveform D. The phase controlled loop attempts to align the delayed signal C with the falling edge of the VCO clock signal D by using the measured time difference between the delayed edge of waveform C and the falling edge of clock D to adjust the position of the edge of waveform D for later transitions that arrive. It should be noted that FIG. 3 shows the optimum alignment between the edges of the waveforms C and D.

The position in time at which a transition arrives determines whether it is decoded as a logic "1" or a logic "0" by the decoder circuit. For a transition to be decoded correctly it must arrive in a certain time slot. This time slot is defined by the falling edges of the VCO signal D. FIG. 3 shows that if the delay Td is equal to half the VCO period T (i.e. half the gap from falling to falling edge) then the read transition will be centred exactly halfway between falling edges of the VCO signal. This is the ideal situation as it allows the read signal to be shifted by equally large amounts T/2 to the left or the right as viewed in FIG. 3 without incurring an error. Shifting occurs in practice because of electrical noise and other factors and so setting Td equal to T/2 provides the maximum margin for coping with noise and thereby minimises the chance of errors.

Figure 2:
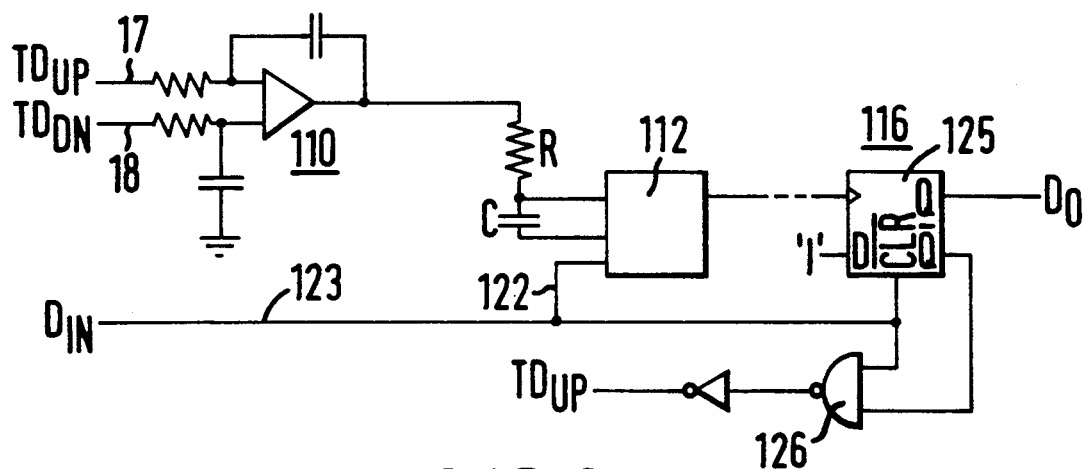
FIG. 2 is a more detailed circuit diagram showing an example of the circuit in accordance with the present invention as used in a tape drive.

It has been the practice to use a fixed delay time in the phase controlled loop. This can lead to problems since the delay will not always be equal to T/2. For example, the VCO signal D is prone to variations in period because of changes in tape speed or the use of different data rates and thus the error margin is reduced. These problems can be overcome using a circuit in accordance with the present invention as illustrated in FIG. 2 of the drawings. Referring to FIG. 2, there is shown a circuit which comprises a tracking delay line arrangement for use in such a tape device. The comparison or differential integrator stage is illustrated at 110 and has the two inputs 117 and 118. The input 117 is a pulse which is derived from the output of the circuit 112 by circuitry 116 and the input on line 118 is a pulse signal whose width is indicative of the period T/2 shown in FIG. 3D. The output of the stage 110 is a voltage signal indicative of the difference between the two pulse inputs 117 and 118 and this is used to control the delay provided by a monostable circuit 112 in a manner described earlier. The monostable circuit receives on an input 122, the signal from line 123 which is to be delayed. The output from the monostable 112 is fed to a further circuit 125 which generates via a gate 126, the signal indicative of the time delay introduced by monostable 112 which is then fed to input 117. Thus it will be seen that the circuit operates by comparing the time delay generated at the output of monostable 112 with the half period of the voltage controlled oscillator clock as represented by the pulse signal at input line 118. In practice a finite amount of time is required to reduce any error between the input period and the output delay and this is called the settling time. Once the apparatus has settled the output delay will accurately reflect the input period of the clock signal as represented on input 118. A typical delay provided by the monostable 112 is 200 ns and an error of less than one ns, i.e. better than 0.5%, can be achieved. This compares with 5% when using a conventional analogue delay line.

If the settling time is small compared to the rate at which the input clock is changing due to speed changes in the tape drive, then the system can follow the changes in the input clock period with very little error; consequently the time delay output tracks the speed changes in the drive generating an optimum time delay under all conditions.

Figure 4:
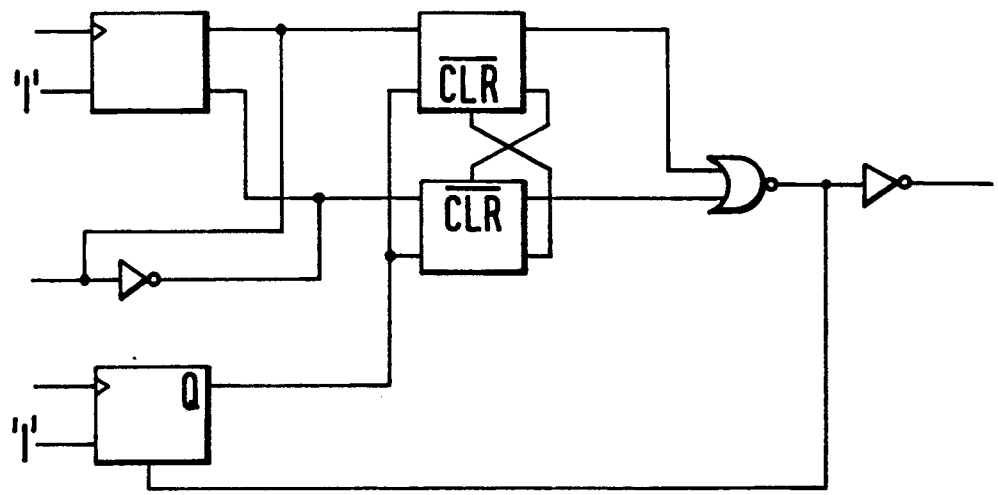
FIG. 4 is a circuit diagram showing a logic circuit which can be used in conjunction with the circuit of FIG. 2.

A circuit for generating the pulse signal at input 118 is shown in FIG. 4 of the drawings. A signal having a frequency of twice the voltage controlled oscillator clock signal is fed to this circuit on line 50 and the circuit operates to produce on output line 51 a pulse equal in width to the clock period. It will be noted that there is a second input into the circuit shown in FIG. 4 and this is shown at 52. This additional input receives the Q output from the circuit 125 and is used to indicate that the delay generator pulse has ended.

Another advantage provided by the circuit of FIG. 2 is the fact that a digital tape device can be required to read two types of tape which have been written at slightly different rates. Changing the data rate changes the size of the decoding window. By using an arrangement of the type shown in FIG. 2 the delay will automatically optimise itself to the relevant data rate.

It will be appreciated that the delay circuit has applications in arrangements other than tape drive. It could be used for example to impliment a high accuracy delay system by providing different frequency clocks to the input of the control system. Alternatively it could find application in hybrid miniaturised form to replace fixed delay lines used in many digital applications.

We claim:

1. An electrical circuit for providing delay in the path of an electrical signal comprising:
    a pulse generator having an input and an output for producing a transition at its output that occurs at a time interval following a transition in a signal applied to its input,
    said pulse generator having means for varying the duration of said time interval in response to a signal applied to a control input thereof,
    means coupled to said pulse generator for producing a pulse signal having the duration of said time interval,
    a source providing a pulse having the duration of a reference time interval,
    means including a differential integrator for comparing said pulse signal having the duration of said time interval and said pulse having the duration of a reference time interval so as to produce an error signal related to the difference between said time interval and said reference time interval, and
    means for coupling said error signal to said control input of said pulse generator so as to maintain a given relationship between the time interval between said transitions and said reference time interval.

2. An electrical circuit as set forth in claim 1 wherein said pulse generator is a voltage controlled pulse generator and said means for comparing said signals produces an error signal that is a voltage signal.

3. An electrical signal as set forth in claim 2 wherein said pulse generator is a monostable device having an RC timing network.

4. A method of delaying a signal by amounts related to the variation in intervals derived from an external device comprising the steps of
    providing delay for a signal,
    producing a pulse having a duration related to said delay,
    deriving a reference pulse having a duration equal to the intervals derived from an external device,
    deriving an error signal equal to the difference between the integrated values of said pulses, and
    changing the delay provided for said signal with said error signal so as to maintain a given relationship between the duration of said reference pulse and the delay provided for said signal.

5. An electrical circuit as set forth in claim 1 wherein:
    said signal that is indicative of said reference time interval has a phase which varies.

6. A circuit for causing a signal of variable phase to occur within the period of a clock cycle comprising:
    delay means having an input to which said signal is applied, a control input to which a voltage may be applied to control its delay and an output at which said signal appears in delayed form,
    means receiving said signal in delayed form and said signal for deriving a first pulse having a duration equal to said delay,
    a source providing a second pulse having a duration equal to one half the period of said clock cycle,
    means including a differential integrator for deriving a control signal corresponding to the difference between the durations of said first and second pulses, and
    means for applying said control signal to said control input of said delay means.

7. A delay circuit comprising:
    means for providing a variable delay having an input for pulses to be delayed, an output for the delayed pulses and control means for adjusting the amount of delay;
    means coupled to said input and said output for deriving pulses having durations corresponding to the amount of delay of the delayed pulses;
    a source providing reference pulses having respective durations corresponding to desired delays;
    a differential integrator having first and second inputs and an output;
    means for coupling said pulses corresponding to said delays to said first input of said differential integrator;
    means for coupling said reference pulses to said second input of said differential integrator; and
    means for coupling the output of said differential integrator to said control means of said means for providing a variable delay, whereby the amount of delay is varied in accordance with variations in the durations of the reference pulses even though they may occur at different times than the pulses corresponding to the amount of delay.

* * * * *